United States Patent [19]

Kosowsky et al.

[11] 3,977,957

[45] *Aug. 31, 1976

[54] APPARATUS FOR INTERMITTING ELECTROPLATING STRIPS

[75] Inventors: Leo N. Kosowsky, Sharon; Curtis N. Lovejoy, Walpole, both of Mass.; John G. Cunniff, Foster, R.I.

[73] Assignee: National Plastics and Plating Supply Co., Terryville, Conn.

[ * ] Notice: The portion of the term of this patent subsequent to Jan. 29, 1991, has been disclaimed.

[22] Filed: Sept. 4, 1974

[21] Appl. No.: 503,097

Related U.S. Application Data

[62] Division of Ser. No. 400,153, Sept. 24, 1973, which is a division of Ser. No. 217,508, Jan. 13, 1972, Pat. No. 3,788,963.

[52] U.S. Cl.............................. 204/224 R; 204/15; 204/206
[51] Int. Cl.².................. C25D 17/00; C25D 17/18; C25D 17/28
[58] Field of Search................ 209/206, 224 R, 207, 209/222, 15

[56] References Cited

UNITED STATES PATENTS

| 3,661,752 | 5/1972 | Capper et al. | 204/206 |
| 3,723,283 | 3/1973 | Johnson et al. | 204/224 R |
| 3,745,105 | 7/1973 | Kosowsky et al. | 204/224 R |
| 3,746,630 | 7/1973 | Kosowsky et al. | 204/224 R |
| 3,788,963 | 1/1974 | Kosowsky et al. | 204/206 |
| 3,860,499 | 1/1975 | Graham et al. | 204/15 |

*Primary Examiner*—T. M. Tufariello
*Attorney, Agent, or Firm*—Cesari and McKenna

[57] ABSTRACT

Apparatus for electroplating selected areas on consecutive segments of metal strip, the apparatus comprising means to advance the strip, means for isolating inertial movement of the strip to hold the strip in a fixed position at all times advancement is not required, and an electroplating cell formed of two parts adapted to clamp together hydraulically isolating all but the aforesaid selected areas from contact with the electroplating fluid. In one embodiment of the invention there is an electronic means to sense whether the proper advancement of the strip has been achieved.

2 Claims, 9 Drawing Figures

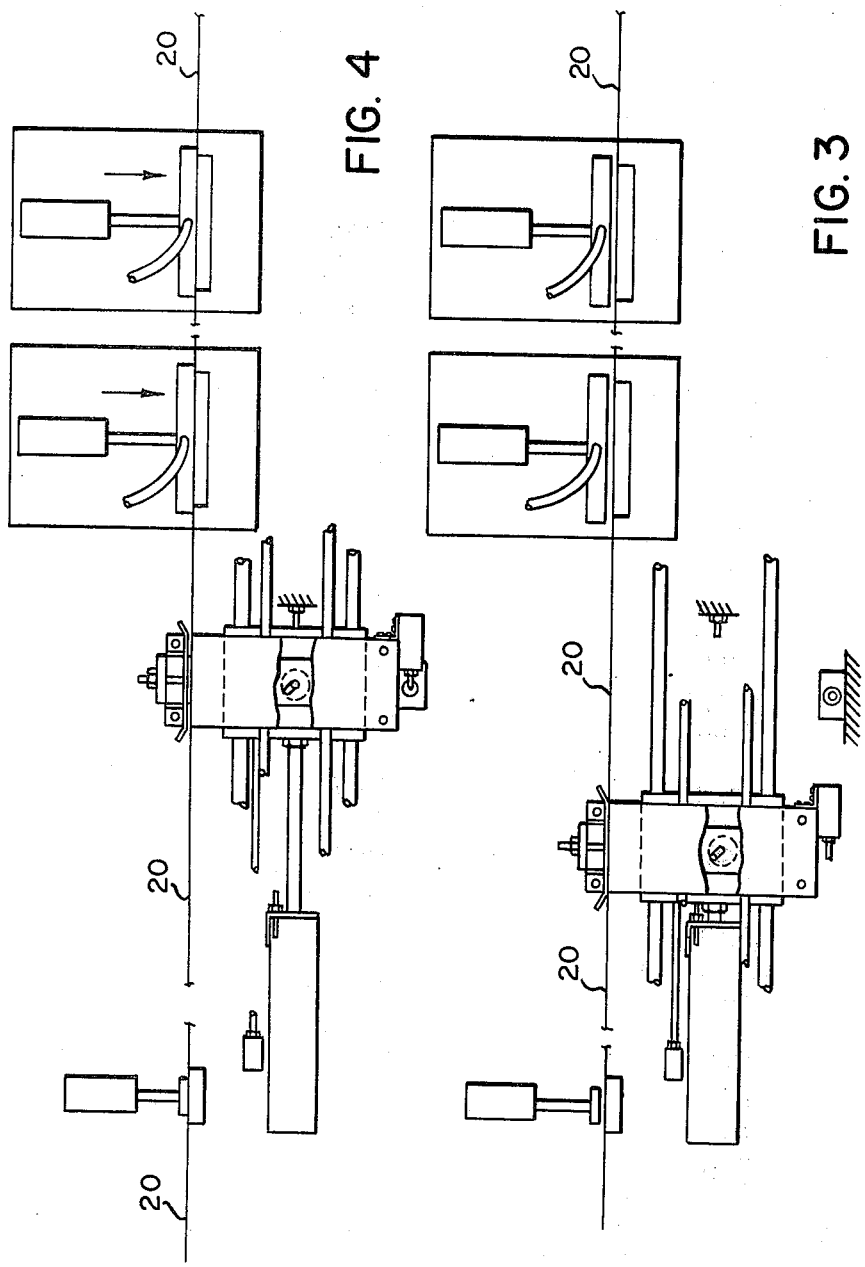

APPARATUS FOR INTERMITTING ELECTROPLATING STRIPS

This is a Divisional Application under 37 CFR 1.60 of pending prior application Ser. No. 400,153 filed Sept. 24, 1973, by Leo N. Kosowsky et al, Ser. No. 400,153 is itself a divisional application from U.S. Ser. No. 217,508 filed Jan. 13, 1972, now U.S. Pat. 3,788,963 by Kosowsky et al.

BACKGROUND OF THE INVENTION

1. Field of the Invention

This invention relates to apparatus and process for electroplating a plurality of pre-selected isolated areas on incremental segments of an elongate metal strip while maintaining the rest of the strip out of contact with the electroplating bath and providing for the controlled advancement of the strip as each segment is positioned for exposure to the electroplating bath.

2. The Prior Art

In many electroplating operations, e.g. operations wherein microcircuits are electroplated with gold, there is a need to minimize the amount of expensive metal utilized by closely restricting its deposition to only those surface areas where its presence is essential. It is desirable, however, that such selective deposition of the metal achieved without resorting to procedures which greatly restrict the production rate of an electroplating facility or to procedures which greatly increase the handling cost of the items being electroplated.

It has been known to use organic coatings to mask those areas of metallic substrates on which electroplating is not required and thereby avoid those areas being electroplated. After electroplating of such partially masked items is finished, the masking material is removed, leaving discrete electroplated zones. Such a process requires expensive coating and stripping steps. These steps add to the cost of the electroplating operation and also increase the probability that some of the costly work product will have to be scrapped because of damage incurred during the manufacturing operations.

The most suitable apparatus of the solution of such problems are disclosed in the commonly-owned and co-pending U.S. patent applications U.S. Ser. Nos. 90,632 and 95,995 filed by Kosowsky et al on Nov. 18, 1970 and Dec. 8, 1970, respectively. Such apparatus uses seal means to selectively isolate the surfaces of sheet which are to be exposed to contact with the electroplating fluid. The latter of these applications describes means to continuously electroplate an elongate suitable for use on very large runs of a strip with a particular metallic pattern; however, it has been found to be inconvenient to modify the sealing parts of such apparatus to accomodate a series of smaller runs on strips of different configurations. Another drawback to this continuous plating-type of apparatus is that it requires a relatively large amount of space because the various processing steps must be carried out as the strip moves through processing stations elongated to compensate for the movement of the strip. Therefore, it is desirable, for smaller orders and for providing apparatus that requires less space, to construct apparatus for the intermittent electroplating of elongate strips which will allow the strips to be advanced step-by-step and, consequently, to be stationary during the electroplating procedure.

Other suggestions have been made for accomplishing the electroplating of small selected areas, but these suggestions have been limited to small-scale, repair-type operations wherein the rigorous requirements of high-rate or continuous manufacture need not be considered. All of these prior suggestions are believed to be "batch-type" processes. For example, Ehrhart, in U.S. Pat. No. 3,071,521, discloses a single grommet-sealed chamber for use in repairing printed-circuits. Swanson, in U.S. Pat. No. 2,698,832, discloses a somewhat similar device utilizing a reservoir for an electroplating solution adapted to empty, by gravity flow, into a receptical for receiving the solution. Neither of these inventions has suggested a way whereby a large number of discrete areas can be carried out continuously at optimum current densities. Indeed, neither inventor, in solving his own particular problem has been faced with problems as complex as those involved in the eltroplating of a plurality of isolated areas on a continuously-advancing strip of substrate.

Ramirez et al, in U.S. Pat. No. 2,974,097, disclose means for continuously plating areas along the edges of a continuous strip. It should be noted, however, that the areas being electroplated are continuous areas running along the entire length of the strip, not a plurality of small areas on the faces of the strip. Thus, the problems of solution, distribution and isolation are much simpler than those encountered by the instant inventors.

All electrodeposited metals have crystalline structures which manifest themselves in the physical properties and appearance of the plated metal. In order to achieve plated deposits of suitable properties, it is necessary to control the current densities. Current densities which are too high will result in deposits of poor quality. Current densities which are too low will result in excessively long plating cycles and markedly reduce the production rate of the plating operations. A particular problem encountered in constructing apparatus which is suitable for continuous and simultaneous electroplating of a large number of selected areas is to assure maintenance of a suitable concentrated cation concentration at each of the discrete areas being plated. Without a suitable high concentration, it would be impossible to obtain a high quality plating in a desirable short time.

In commercial work, preparation of surfaces for plating is often as important as the electroplating step itself. This is especially so in electroplating surfaces for use in microcircuit components. Thus, special care should be exercised in the construction of apparatus to assure that the surfaces to be electroplated are processed with minimal contact by machine parts or by an operator's hands. This requirement has increased the difficulty of providing suitable apparatus for the electroplating of a large number of selected areas along a single, but extensive substrate.

SUMMARY OF THE INVENTION

Therefore, it is an object of the instant invention to provide compact apparatus which can quickly and conveniently effect the uniform electroplating of a large number of pre-selected, discrete, surface zones of a strip of substrate as it is intermittently advanced along a processing line.

A further object of the invention is to provide apparatus as described above which has a positive mechanical relationship between an advancement mechanism and a strip engagement means incorporated therein to assure the disengagement of the strip during a stroke of the advancement means.

Another object of the invention is to provide apparatus for intermittent processing of an elongate strip which provides means to hold said strip fast against spurious movement throughout said processing.

Another object of the invention is to provide electroplating apparatus for intermittent electroplating of a strip which comprises means to automatically confirm the satisfactory advancement and positioning of said strip on each advancement thereof.

Other objects of the invention will be obvious to those skilled in the art on reading the instant application.

The above objects have been substantially accomplished by providing a novel electroplating apparatus having mechanical locking means associated with a number of serially arranged processing stations through which segments of an elongate metal strip is passed as the strip is intermittently advanced. These mechanical locking means serve to assure there will be no transmission of movement between the electroplating bath and windup systems. Such movement would result in the placement of gold on the wrong part of the strips being electroplated. Such wrong placement must be avoided because of the high cost of gold.

In this application and accompanying drawings there is shown and described a preferred embodiment of the invention and suggest various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as may be best suited in the condition of a particular case.

FIGS. 3 and 4 are a more detailed plan view of that portion of the apparatus wherein the strip is electroplated and engaged for advancement.

It will be obvious to those skilled in the art from reading the following description that the control system described is partly hydraulic. The description hereinbelow refers to the solenoid actuators of valves for the hydraulic fluid system rather than the hydraulic conduits and pumping associated therewith. The latter are shown in sufficient detail in FIG. 6 to define the apparatus being described for all those skilled in the art.

Figure 2:
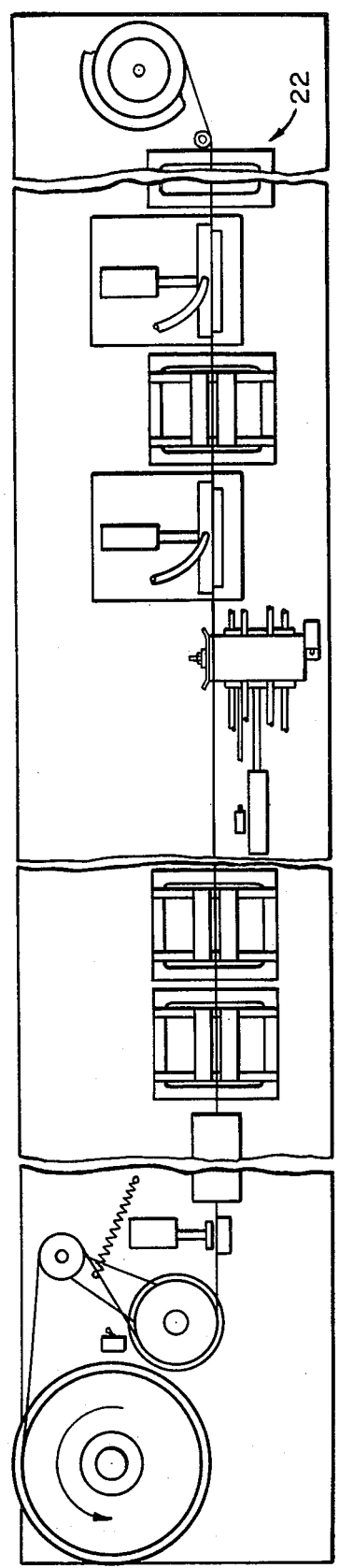
FIG. 2 is a plan view of the production line shown in FIG. 1.
Figure 1:
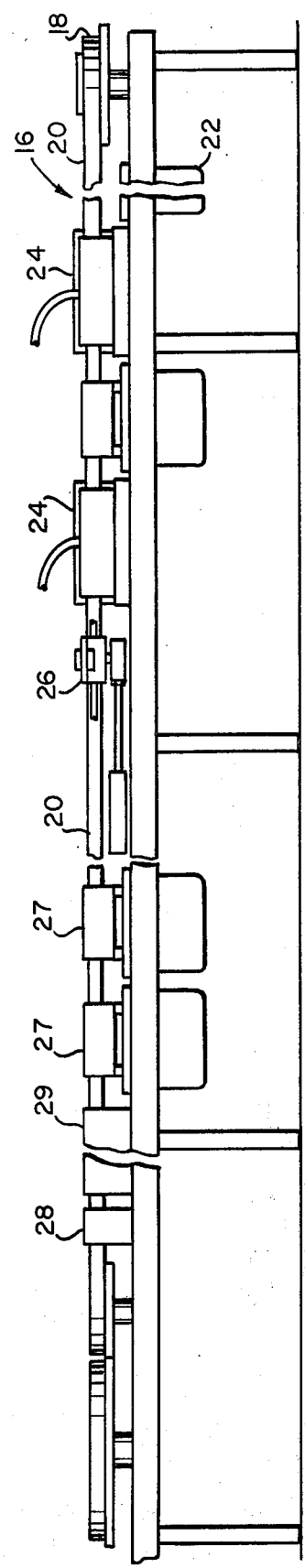
FIG. 1 is a schematic elevation of a part of a production line whereon selected portions of a strip of metal are electroplated.

Referring to FIGS. 1 and 2 it is seen that electroplating production line 16 comprises a supply roll 18 of perforated metal strip 20 which is to be electroplated. The strip is fed through a number of cleaning baths illustrated schematically at 22 but not shown in any detail because such cleaning steps are old in the art and do not form any part of the present invention. After passing through the cleaning baths, the metal strip is electroplated in at least one of electroplating stations 24, then engaged by an intermittently actuated positive action advance mechanism 26 and pushed forward through post-electroplating treatment baths 27 and oven 29. Thence strip 20 passes through a vise member 28 and into a spooling apparatus 30.

Figure 5:
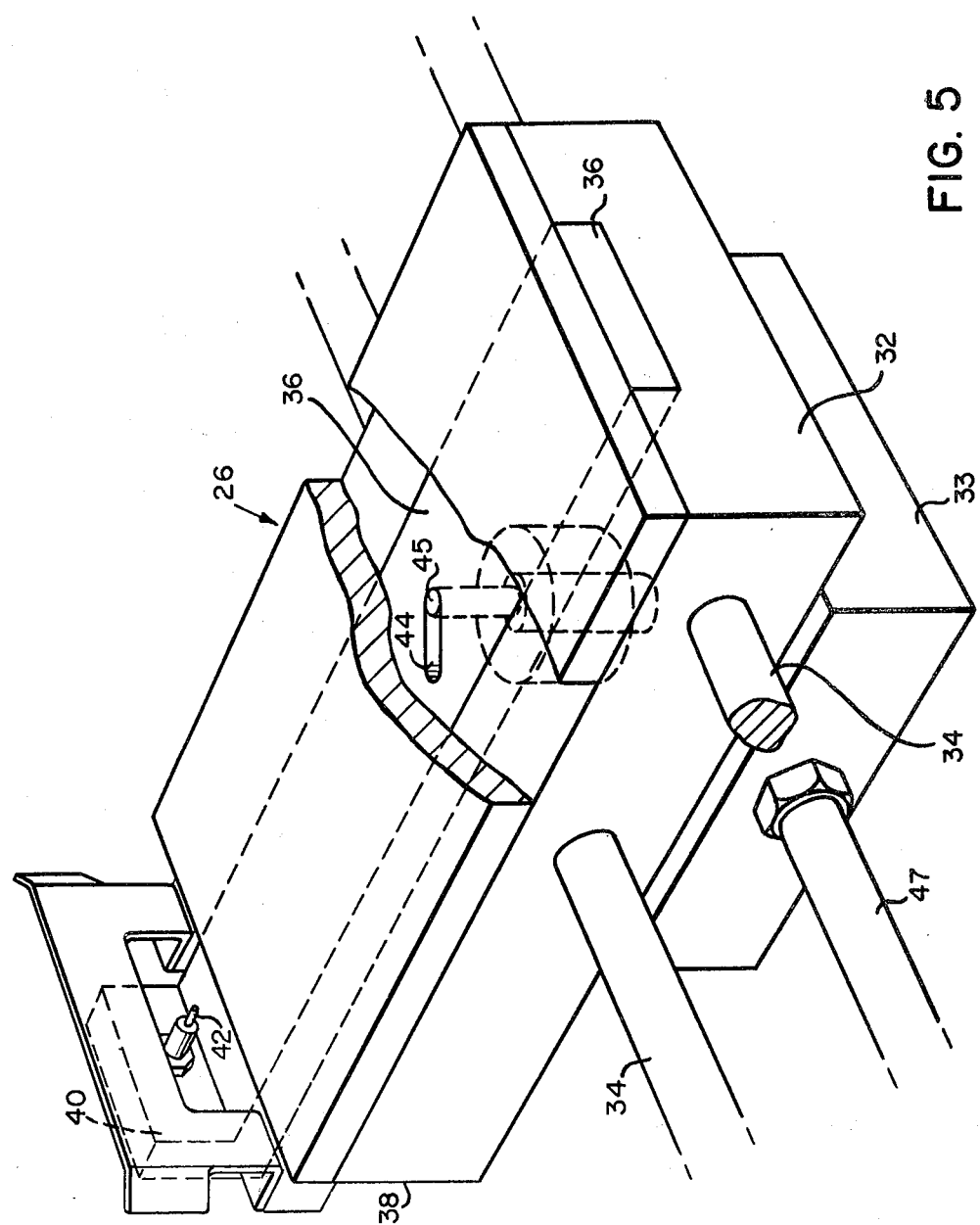
FIG. 5 is a perspective view partially cut away of the advance mechanism.

FIGS. 3 and 5 illustrate advance mechanism 26 in more detail. Advance mechanism 26 comprises a block 32 mounted for travel along support rods 24. This block 32 encloses means to carry an advance bar 26 which protrudes from one side 38 of block 32 and carries a pin support member 40 and an advance pin 42. Advance bar 36 is adapted for controlled lateral movement within block 32 by means of a cam slot 44 therein which, as described in more detail below.

Figure 7:
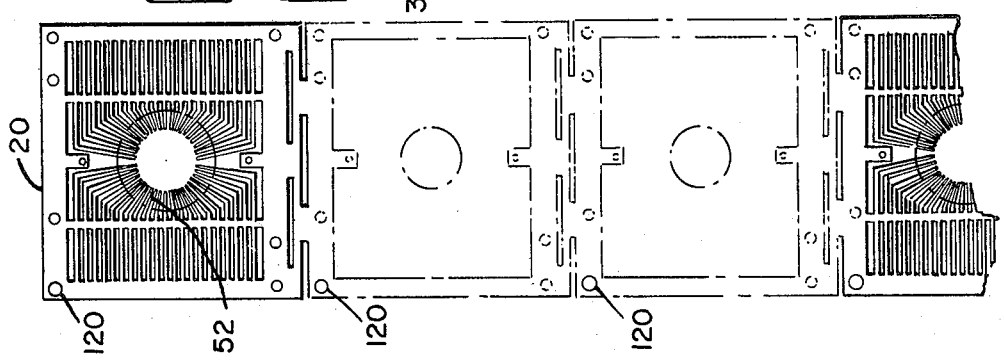
FIG. 7 illustrates a typical strip processed on the apparatus of the invention.

FIG. 7 shows a portion of a metal strip 50 which is foraminous enough to allow the passage of electroplating fluid therethrough and on which it is desirable to electroplate a metal, say gold only on the surface 52 indicated within the dotted circles 54 on each segment of the strip.

Referring now to the schematic diagram of FIG. 6 together with the other drawings, the operation of the apparatus is described as follows starting with the forward movement of advance mechanism 26.

As advance mechanism 26 is moved forward by the action of an operating rod 47 of pneumatic cylinder 48, (i.e. to the left in FIGS. 3 and 4), the first ½ inch of travel causes pin 45 which is fastened to support block 33 to be pulled to the right (as shown in FIG. 5) in cam slot 44 thereby pulling advance bar 36 and advance pin 42 to the right. Top block 32 does not move until it is engaged by pin 45 at the right end of the cam slot. By this time, advance pin 42 will have entered a hole in strip 20, thereby engaging it for forward movement as this ½ inch forward motion of advance mechanism 26 is completed, the mechanism also actuates a one-way roller actuator 56 (see FIG. 6). Actuator 56, in turn, acutates a limit switch 58. Limit switch 58 causes the opening of vise 28 through the energizing of solenoid 60.

At this point in time the strip can be moved forward and starts its advance in unison with the entire advance mechanism 26 until it engages a mechanical stop 62 and probe 64 engages limit switch 66. Switch 66 actuates solenoids 68 and 70. The former solenoid causes vise 28 to grip strip 22. Solenoid 70 causes movable plating heads 72 of electroplating cells 24 to press against strip 22. As plating heads 72 move toward the strip 20, they close a normally open switch 74 and open a normally closed switch 76. Switch 74 activates solenoid 78 and switch 76 deactivates solenoid 80. Thus the pneumatic cylinder 48 is actuated and operating rod 47 moves to the right in FIG. 6, thereby retractng the advance mechanism.

As the advance mechanism starts to retract, the advance pin 42 is pulled out of engagement with the atrip 20 before the pin starts to move with the advance mechanism. The first half-inch of movement of support block 33 merely causes the pushing of advance bar 36 to the left by cam slot 44 and cam pin 45, as shown in FIG. 5. Thereupon blocks 32 and 33 become engaged and the advance mechanism moves to its orginal position where it strikes another mechanical stop 81.

Switch 76 also turns on rectifiers 82 through a timer 84 which controls the time during which current is supplied to electroplating stations 24.

The movement of movable electroplating cell members 72 has been seen to actuate switches 74 and 76. This movement also depresses a one-way roller actuator 86. Actuator 86 momentarily closes to actuates a magnetic clutch (not shown) which in turn allows engagement of a continuously running motor drive with take-up reel 88 of spooling apparatus 30. Reel 88 will rotate, thereby winding up strip 20, until idler arm 90 is swung forward to contact shutoff switch 92. Idler arm 90 is biased by spring biasing means 94 and, as the strip is wound upon reel 88, idler arm 90 is pulled forward to contact switch 92. The strip is maintained under appropriate tension at all times by the biased idler arm as it is carried around rolls 96 and 98.

The spring 94 also serves to pull idler arm 90 and most notably roll 96 backwardly away from shutoff switch 92 when the take up reel is not turning. This allows an increment of strip 20 to be held under continuous tension as it is fed past vise 28 during the advancement of strip 20.

When timer 84 signals the end of the electroplating cycle, rectifiers 82 are shut off and solenoid 102 is energized thereby activating the movable sectors 72 of plating stations 24 to retract into their open positions. Switch 74 opens, switch 76 closes to activate solenoid 80 and start another cycle.

It will be noted on careful study of the above-identified apparatus and procedure for the operation thereof, that the strip while being intermittently carried through the processing apparatus is mechanically isolated during each processing step so that spurious movement thereof, whether it be vibratory or inertial, cannot be transmitted along the tape. Thus during the wind-up procedure, a vise 28 carefully isolates spooling apparatus 30 from the rest of the system. Similarly, when vise 28 is open to permit advancement of the strip, the strip is positively engaged for forward motion by advance pin 42. As the advance pin ceases its forward motion, vise 28 and electroplating cells again clamp the strip to prevent motion thereof.

Figure 8:
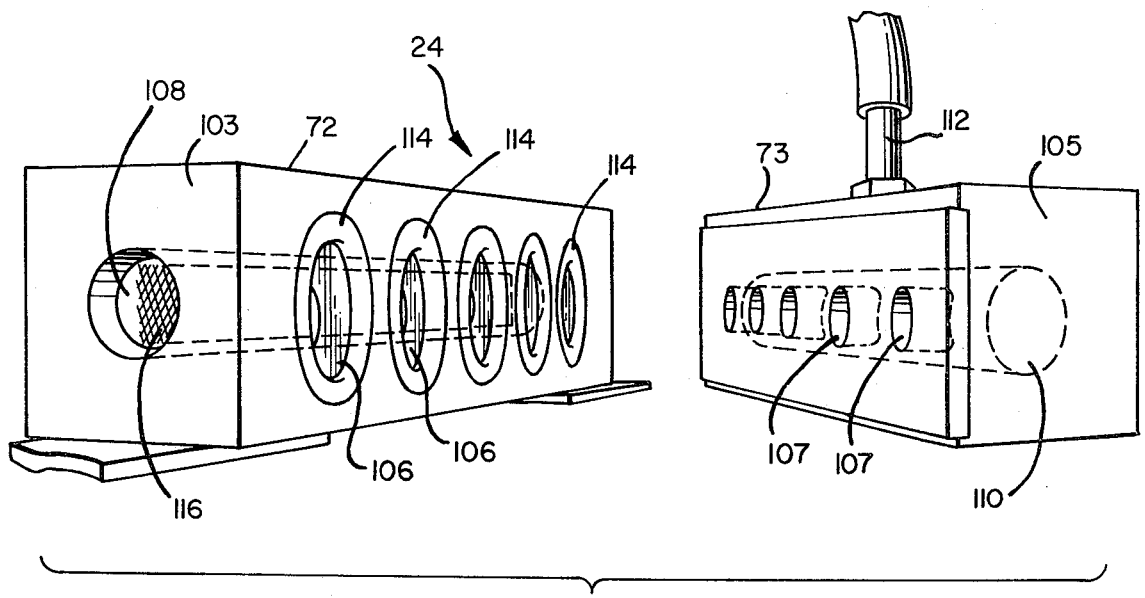
FIG. 8 illustrates the plating cells used with the apparatus of the invention.

FIG. 8 is a perspective view of an electroplating station 24 the perspective being exaggerated to better show the detail of the various parts thereof. The station comprises a movable plating head 72 and a stationary plating head 73. Movable plating head comprises a housing 103 and a row of apertures 106 on that face of housing 103 which faces plating head 73. Plating head 73 has a housing 105 having another row of aperture 107 in register with, and smaller than apertures 106. Each set of apertures is connected to central conduits 108 or 110. The former conduit provides means to distribute incoming plating solution to aperture 106; the latter conduit forms means to receive plating fluid through apertures 107 and to discharge this outgoing plating solution through conduit 112.

Piping attachments to head 72 are not shown. Those skilled in the art will be able to arrange whatever piping, preferably flexible piping, that is required to supply solution to the assembly. The terminals of conduits 108 and 110 can be used or may be plugged when other supply conduits are machined into the housing.

The contact between plating head 73 and 72, on their gripping metal strip 20 being electroplated, is a sealing contact provided by resilient elastomeric O-rings 114 which are inserted in housing 103 about the periphery of apertures 106. These O-rings protrude slightly and thereby form means to sealingly contact the strip being processed so that plating solution contacts only that part of the strip defined by circular apertures 106. The pressure of these O-rings 114 is counteracted on the other side of strip 20 by a rubber face plate 116 which is inset in the face of housing 105. Thus when plating heads 72 and 73 are brought into pressured contact with strip 20 in an additional vise-like clamping action, they form a conduit which may be as wide as is necessary to electroplate any desired portion of the plate on either side of the strip. The particualr area electroplated will depend on the size selected for apertures 106 and 107. In the illustrated case, the intention is to avoid any electroplating on that side of the strip adjacent apertures 107, and to plate a circular area as indicated in FIG. 7 on that side of the strip adjacent apertures 106.

In the electroplating process, the metal strip being plated will form the cathode. The anode is advantageously a screen 116 placed in conduit 108.

A particularly advantageous feature is incorporated into the preferred embodiments of the invention whereby the electroplating function can be stopped and the apparatus shut down if some malfunction of the system causes the strip to be out of position at the time the electroplating step is to take place. FIG. 7 illustrates the fenestrated nature of the strip being processed. There are, of course, a large number of points on each repeating portion of the strip which could be used in the operation described hereinbelow. However, to minimize the possibility of malfunction, a relatively isolated aperture like aperture 120 in FIG. 7 is usually selected for the operation.

Figure 9:
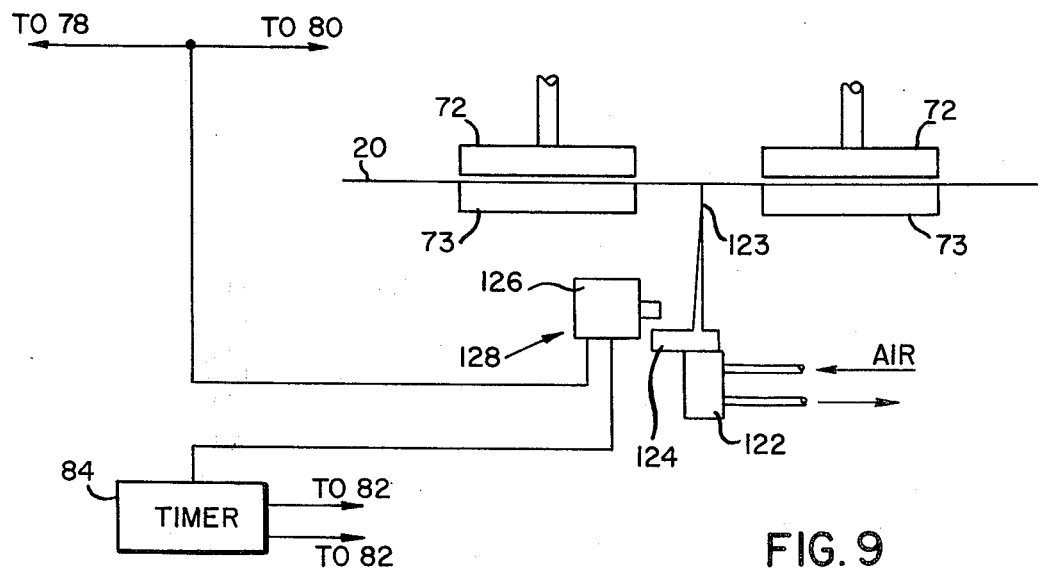
FIG. 9 is a schematic diagram showing a warning-control mechanism useful as part of the apparatus of the invention.

With reference to FIG. 9, it is seen that strip 20 is in a given position, that position being so that the central aperture in the strip pattern is in register with the hole 107 of FIG. 8. Mounted along strip 20 is a probe or pin 123 operated by a solenoid-actuated pneumatic cylinder 122. Probe 123 is so mounted that, if it is not pushed forward during the plating cycle, an operating arm 124 attached thereto will not be carried forward sufficiently to close a normally open limit switch 126. If limit switch 126 does not close, the rectifiers will not be made operable and electroplating will not commence. The effect of this failure in the cycle will be to stop the cycle.

Probe 123 is mounted along the processing line so that it will only advance forward if it meets a hole, e.g. aperture 120, in metal strip 20. Thus it is so placed that it meets that hole only when the center aperture is in proper register with the plating heads.

Figure 6:
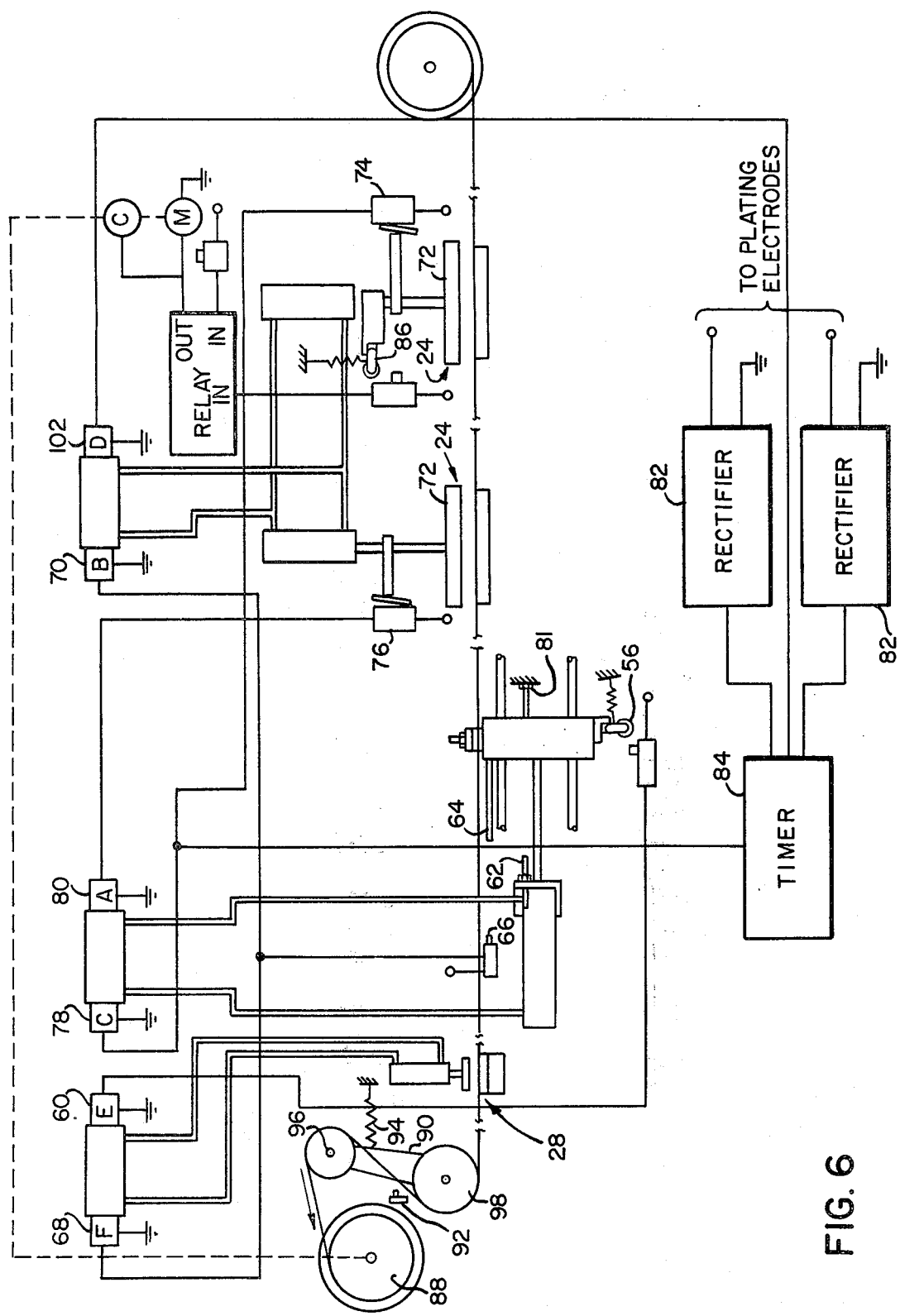
FIG. 6 is a schematic diagram of the control system.

FIG. 9, schematic in detail, shows how the sensing pin assembly 128 works in relation to FIG. 6. The air supply to the pneumatic cylinder for pushing the pin forward is provided through the action of solenoid 70, i.e. the same action that moves the movable plating heads 72. FIG. 9 shows the normally open switch 126 left in that position, because of the failure of pin 123 to penetrate strip 20 because of incorrect registration of pin and strip aperture 120.

It is also to be understood that the following claims are intended to cover all of the generic and specific features of the invention herein described, and all statements of the scope of the invention which, as a matter of language, might be said to fall therebetween.

What is claimed is:

1. In apparatus for electroplating pre-selected portion of a continuous metallic strip and comprising
   A. advancement means adapted to engage said strip and move it forward intermittently;
   B. an electroplating cell adapted to clamp and seal portions of the surface of said strip to hydraulically seal portions of said strip against exposure to electroplating fluid and to hydraulically seal a plurality of other pre-selected portions of the surface to be electroplated into a conduit forming means to supply electroplating fluid to said plurality of surfaces; and
   C. means to wind up said strip.

2. Apparatus as defined in claim 1 wherein said electroplating cell comprises one stationary plating head, one removable plating head, and elastomeric sealing means forming apertures for electroplating fluid on opposed faces of said plating heads.

* * * * *

UNITED STATES PATENT OFFICE
CERTIFICATE OF CORRECTION

Patent No. 3,977,957    Dated August 31, 1976

Inventor(s) Leo N. Kosowsky, Curtis N. Lovejoy & John G. Cunniff

It is certified that error appears in the above-identified patent and that said Letters Patent are hereby corrected as shown below:

Column 4, line 63: "atrip" should be --strip--

Signed and Sealed this

Twenty-second Day of March 1977

[SEAL]

Attest:

RUTH C. MASON
*Attesting Officer*

C. MARSHALL DANN
*Commissioner of Patents and Trademarks*